United States Patent [19]

Jeon

[11] Patent Number: 5,027,172

[45] Date of Patent: Jun. 25, 1991

[54] DYNAMIC RANDOM ACCESS MEMORY CELL AND METHOD OF MAKING THEREOF

[75] Inventor: Jun-Young Jeon, Seoul, Rep. of Korea

[73] Assignee: SamSung Electronics Co., Ltd., Kyung Ki-Do, Rep. of Korea

[21] Appl. No.: 451,775

[22] Filed: Dec. 18, 1989

[30] Foreign Application Priority Data

May 19, 1989 [KR] Rep. of Korea ............... 1989-6720

[51] Int. Cl.⁵ .................. H01L 29/68; H01L 27/02; H01L 27/10; H01L 29/06
[52] U.S. Cl. ............................. 357/23.6; 357/51; 357/45; 357/55
[58] Field of Search ............. 357/23.6, 51, 45, 55

[56] References Cited

U.S. PATENT DOCUMENTS 4,894,696  1/1990  Takeda et al. ............... 357/23.6

FOREIGN PATENT DOCUMENTS 61-50445  3/1986  Japan ............... 357/23.6
62-248248  10/1987  Japan ............... 357/23.6
62-290168  12/1987  Japan ............... 357/23.6
63-239969  10/1988  Japan ............... 357/23.6

Primary Examiner—Rolf Hille
Assistant Examiner—Robert P. Limanek
Attorney, Agent, or Firm—Robert E. Bushnell

[57] ABSTRACT

A method of making a DRAM cell capable of increaisng storage capacity and for which is amendable to large-scale integration. The method provides a DRAM cell having stacked and trench capacitors and a transistor of second conductivity type opposite to a first conductivity type on a semiconductor substrate of the first conductivity type. Polycrystalline silicon of a cell node in the stack capacitor is coupled to source region of the transistor. The cell node of the trench capacitor is coupled to the source region of the transistor through an N-type diffusion region around the trench that is formed between said source region and a field oxide. Over the trench capacitor is disposed the stacked capacitor, and the cell nodes are coupled to each other. A cell plate filling the inside of the trench may be used in common since it surrounds the polycrystalline silicon, that is, the cell node of the stacked capacitor.

11 Claims, 5 Drawing Sheets

DYNAMIC RANDOM ACCESS MEMORY CELL AND METHOD OF MAKING THEREOF

BACKGROUND OF THE INVENTION

1. Field of the invention

The present invention relates to a dynamic RAM (DRAM) cell, and more particularly to a method of making a DRAM cell which is capable of increasing storage capacity by parallel connecting a trench capacitor with a stack capacitor.

2. Description of the Prior Art

One DRAM cell comprises one transistor in which a drain-source channel is coupled between a bit line and a cell node, and one storage capacitor which is connected between the cell node and cell plate. By the increase of DRAM memory density, there has been developed a DRAM cell having a trench capacitor and stack structure in order to maximize storage capacity on a fixed area occupied by DRAM cell.

FIG. 1 is a cross-sectional view showing a preferred embodiment of a known trench capacitor cell.

As shown in FIG. 1, a known trench capacitor cell comprises a N-channel MOS transistor, a diffusion layer 8, a dielectric film 9 and a polycrystalline silicon 11. The N-channel MOS transistor comprises a source region 3 which is adjacent to a field oxide 10 formed on the surface of a p-type substrate 1, a drain region 2 separated through-channel, and a word line 5 formed by a polycrystalline silicon of a conductivity type being grown on a gate oxide 4 on the substrate between the drain 2 and source region 3. The diffusion layer 8 is formed on the outside substrate of a trench 7, and utilized as a cell node by contacting with the source region 3. The dielectric film 9 is formed on the inside of trench 7. The polycrystalline silicon 11 on the dielectric film 9 is used as a cell plate by filling up the trench. Also, adjacent word line 6, being a gate electrode of adjacent memory cell, is formed on a portion of field oxide 10 with being separated from the polycrystalline silicon 11 layer by an insulating film 12.

In the trench capacitor described above, a trench must be deeply dug in order to have a large storage capacity, so a transistor is formed after forming the capacitor, a diffusion layer formed under trench is extended by continuous process steps. If large scale integration of DRAM memory cell causes the distance between trenches and to decreased the distance of diffusion regions of adjacent cells to be very narrow, so that there is a problem that information stored in the capacitor is lost due to leakage current flowing through a substrate.

FIG. 2 is a cross-sectional view showing a preferred embodiment of a known stack capacitor.

As shown in FIG. 2, a known stack capacitor includes a N-channel MOS transistor, a dielectric film 29 and a polycrystalline silicon layer 31. The N-channel MOS transistor has a source region 22 which is adjacent to a field oxide layer 30 formed over the p-type semiconductor substrate 20, a drain region 21 separated by a channel, and a word line 24 formed by a polycrystalline silicon of a conductivity type being grown over a gate oxide layer 23 on the substrate between the drain 21 and source region 22. The dielectric film 29 of dielectric material is formed on the inside surface of a trench 26 which is formed in the substrate under the source region 22. The polycrystalline silicon 31 formed over the dielectric film 29 is used as a cell plate layer. Also, word lines 24 25 and a polycrystalline silicon layer 27 used as a cell node layer, are separated by an insulating film 28, and a bit line 35 separated by an insulating film 34 over polycrystalline silicon layer 31 utilized as a cell plate layer, is connected with drain region 21 through an opening hole. The insulation film 34 consists of oxide film 32 and BPSG film (Boro-phospho Silicate Glass) 33.

However a stack capacitor described above has a small rate of increase in storage capacity according to extension of area by trench process due to a fixed thickness of a polycrystalline silicon layer used for the cell node layer, there is also a problem that if a trench hole is small, it is difficult to deposit a polycrystalline silicon layer for forming a cell plate over the inside trench.

SUMMARY OF THE INVENTION

It is therefore an object of the present invention to provide a method of making a DRAM cell which is capable of increasing storage capacity and for large-scale integration.

To achieve the above described object of the present invention, a DRAM cell which includes a field oxide layer formed over the surface of a semiconductor substrate of a first conductivity type in order to separate adjacent cells, a drain and source region of a second conductivity type, opposite to the first conductivity type, separated from themselves by a given distance on the substrate, and a gate oxide on the substrate between the source and drain region, and word lines of conductivity type being grown on the field oxide, with the DRAM cell including:

a trench formed under a given portion between the source region and field oxide, a diffusion layer connected with the source region by ion-implanting impurities of a second conductivity type into the substrate of the outside trench;

a first polycrystalline silicon layer connected with the source region and isolated from the word lines by a first insulating film;

a dielectric film formed on the inside surface of the trench and a first polycrystalline silicon;

a second polycrystalline silicon formed on the dielectric film so as to fill the inside of the trench; and a bit line connected with the drain region through an opening hole and isolated by a second insulating film.

Further, to achieve the above described object of the present invention there is, a method of making the DRAM cell having a stacked and a trench capacitor and a transistor of second conductivity type opposite to the first conductivity type on a semiconductor substrate of the first conductivity type. The said method of making the DRAM cell includes steps of:

forming a thick field oxide on a portion of the surface of the semiconductor substrate, a source region of a second conductivity type which is adjacent to the field oxide, and a drain region of the second conductivity type separated through channel region on the surface of the semiconductor substrate, a gate oxide on the surface of the source region, channel and drain region, and then word lines of conductivity type over the channel region and a given region of the field oxide, respectively;

forming a first insulating film on the word lines, exposed gate oxide and field oxide, and an opening hole at the first insulating film and gate oxide overlaying the source region;

forming a first polycrystalline silicon on the source region to fold with portions of the word lines;

forming a trench over the source, substrate and first polycrystalline silicon formed into the opening hole, and a diffusion layer of a second conductivity type on the outside substrate of the trench in order to be connected with the source region, and then a dielectric film on the first insulating film, first polycrystalline silicon and the surface of the trench;

forming a second polycrystalline silicon on the dielectric film to fill the inside of the trench and to fold with a portion of the word line on the channel region; and depositing oxide and Boro-Phosphorous Silicon Glass film over the second polycrystalline silicon and dielectric film, and forming an opening hole on the drain region and making a metal-silicide film.

BRIEF DESCRIPTION OF THE DRAWINGS

The features and advantages of the process according to the present invention will now be explained hereinafter with reference to the accompanying drawings.

DETAILED DESCRIPTION OF THE INVENTION

Figure 1:
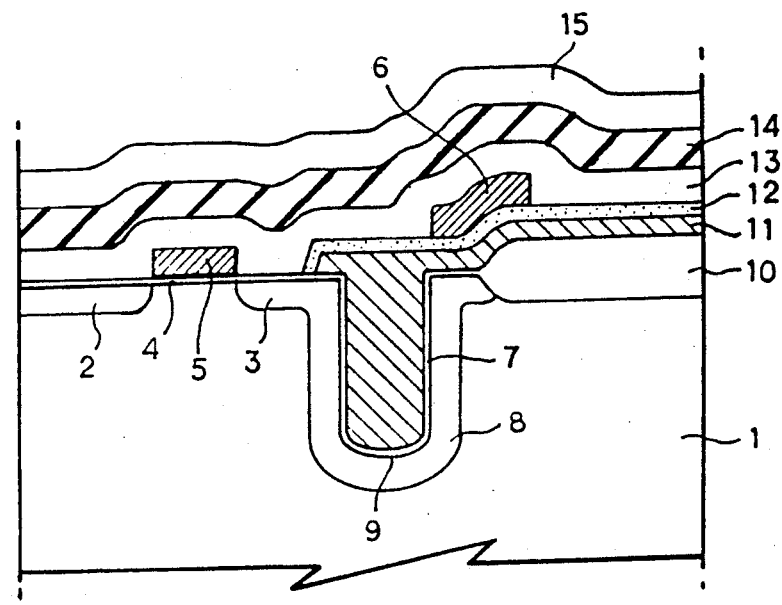
FIG. 1 is a cross-sectional view showing a preferred embodiment of a known trench capacitor cell.
Figure 2:
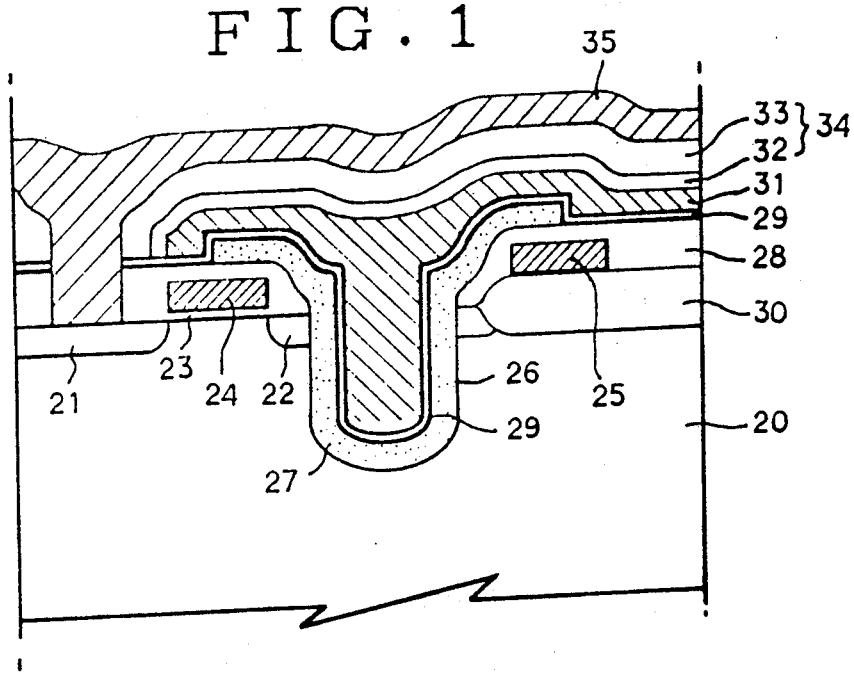
FIG. 2 is a cross-sectional view showing a preferred embodiment of a known stack capacitor cell.
Figure 3:
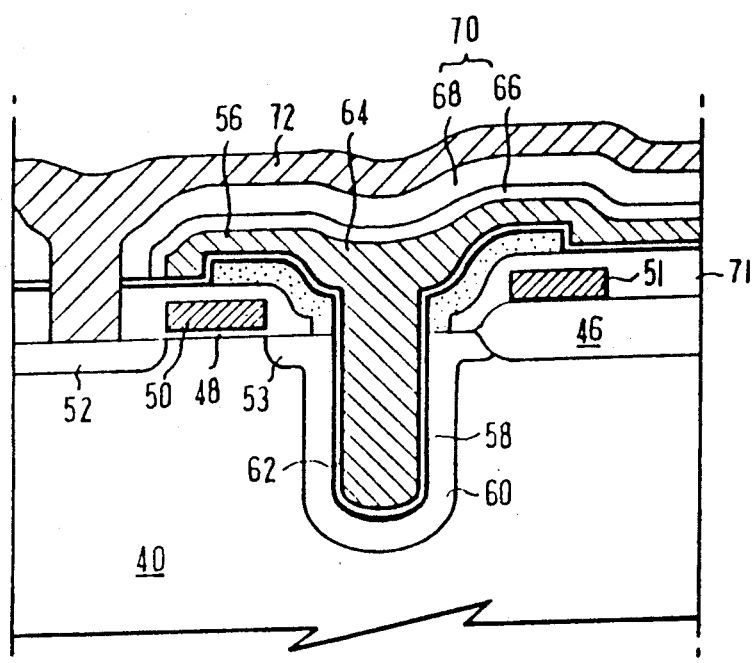
FIG. 3 is a cross-sectional view of cell in parallel connected stack capacitor with trench capacitor according to the present invention.

FIG. 3 is a cross-sectional view of a DRAM cell formed by the present invention. The structure of DRAM cell includes an N-channel transistor and at least one storage capacitor including a stack capacitor and a trench capacitor. The N-channel MOS transistor includes source region 53 which is adjacent to a field oxide layer 46 formed over the surface of a p-type semiconductor substrate 40, a drain region 52 separated by a channel and a word line 50 or a gate electrode of a conductivity type being grown over a gate oxide 48 on the substrate between the drain 52 and source region 53. The first polycrystalline silicon layer 56 is separated from the word lines 50, 51 by a first insulating film 71 and is connected with the source region 53 to provide a cell node layer of the stack capacitor. The N-type diffusion region 60 is formed around trench 58 between the source region 53 and field oxide layer 46 to provide a cell node layer of the trench capacitor. The second polycrystalline silicon layer 64, filling the trench 58, is formed on the dielectric film 62 and utilized as a cell plate layer of the stack and trench capacitor.

Therefore, the stack capacitor comprises the first polycrystalline silicon 56, the thin dielectric film 62 and the second polycrystalline silicon 64, and the trench capacitor comprises the diffusion region 60, the thin dielectric film 62 and the second polycrystalline silicon 64. The stack and trench capacitor is parallel connected to the source region 53. A bit line 72 separated from the second polycrystalline silicon 64 by a second insulating film 70, is connected to the drain region 52 through an opening hole. The second insulating film 70 has an oxide 66 and Boro-Phosphorous Silicon Glass hereinafter BPSG ) film 68. Also, the word line 51 is formed on the field oxide 46 to provide a gate electrode for the adjacent memory cell.

Figure 4A:
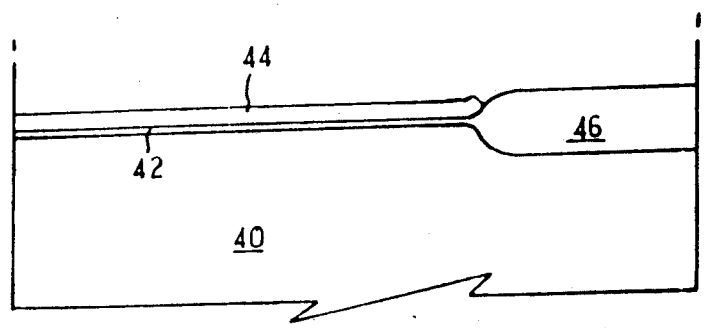
FIGS. 4A to 4G are cross-sectional views showing each stage of manufacturing a DRAM cell according to the present invention.

FIGS. 4A to 4F are cross-sectional views illustrating the process steps of manufacturing the DRAM cell with the structure of FIG. 3, wherein it should be noted that the same reference numerals indicate the same portions or compositions. Referring to FIG. 4A, the starting material is a p-type substrate with a concentration of $10^{16}$ ions/cm$^3$. It is noted that the substrate 40 may be a P-type well formed in a p-type wafer with a sheet resistance of 10Ω-cm. A field oxide 46 is formed on the substrate 40 for isolation between memory cells. That is to say, after depositing an oxide layer 42 having a thickness of about 200 Å and a nitride layer 44 having a thickness of about 1000 Å on the substrate 40, there is removed a portion of nitride layer 44 except the transistor region by a conventional photolithographic method, and a field oxide 46 is formed for isolation between memory cells by means of a LOCOS (Local Oxidation of Silicon) method.

Figure 4B:
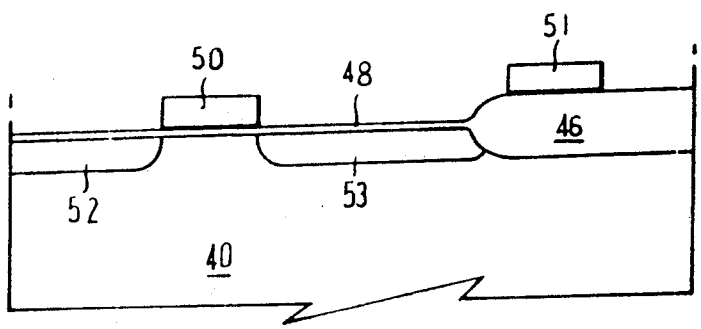

Referring now to FIG. 4B, after removing the nitride layer 44 and the oxide 42, a gate oxide having a thickness of about 160 Å is grown on the substrate 40. Thereafter, a polycrystalline silicon layer having a thickness of about 2500 Å and Low Temperature Oxide (LTO) of 1500 Å are sequentially deposited on the gate oxide 48 and field oxide 46, after forming a gate electrode or word lines 50, 51 by a conventional photolithographic technique, then there are formed a source 53 and drain region 52 by means of ion-implantation with Arsenic (As) having a dose of $5 \times 10^{15}$ ions/cm$^3$ and an energy of 40 KeV. Above, the word line 51 on the field oxide 46 becomes a gate electrode of the adjacent cell.

Figure 4C:
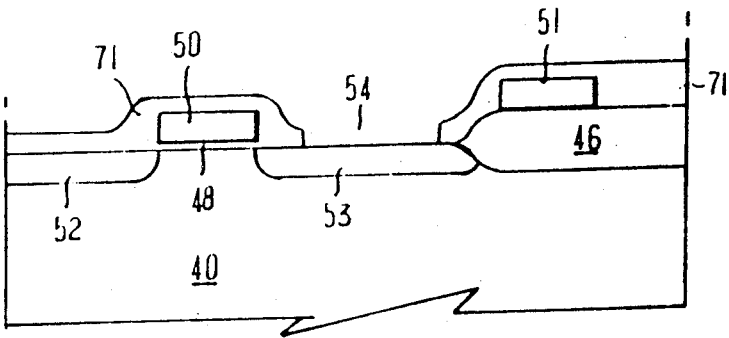

Referring to FIG. 4C, a first insulating film 71 having a thickness of 2000 Å such as LTO film is deposited on the word lines 50,51, field oxide 46 and exposed gate oxide 48 by means of a known CVD (chemical Vapor Deposition). And there is formed an opening hole 54 on a given portion of the source region 53 in order to expose the source region 53.

Figure 4D:
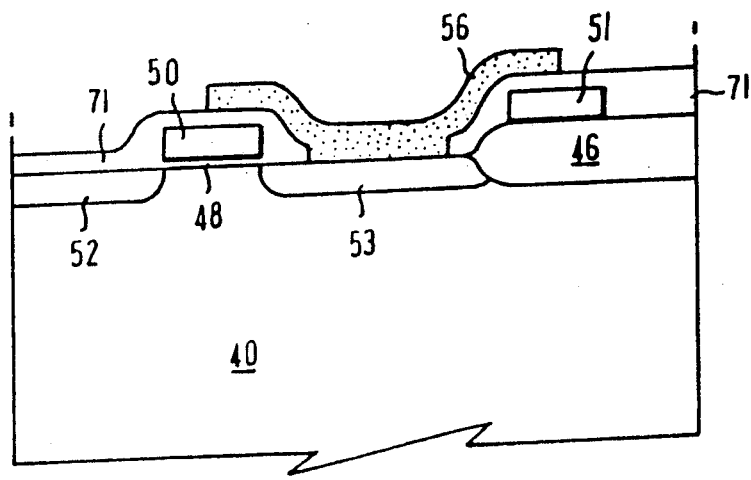

Referring now to FIG. 4D, after depositing a first polycrystalline silicon layer 56 having a thickness of about 1000 Å on the first insulating film 71 and exposed source region 53, then a photolithographic technique is performed. The first polycrystalline silicon 56 is used as a cell node layer of stack capacitor, and is doped with POC13 or ion implantation. The surface area of the first polycrystalline silicon becomes larger due to extending over the word lines 50, 51.

Figure 4E:
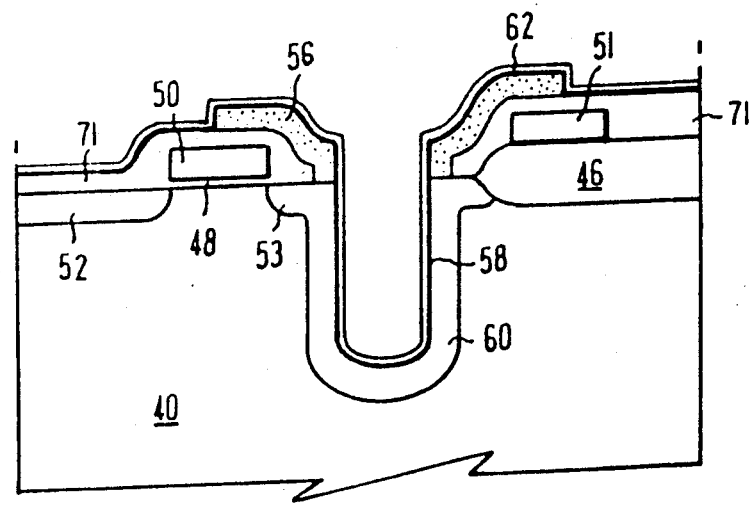

Referring to FIG. 4E, after forming a trench 58 in the first polycrystalline silicon layer 56 in contacted with the source region 53 and its lower substrate 56 by means of anisotropic etching like conventional reactive ion etching, a N-diffusion region 60 is formed by ion implantation of arsenic with a dose of $5 \times 10^{15}$ ions/cm$^3$ at 130 KeV, there is then formed a dielectric film 62 having a thickness of about 100 Å on the first polycrystalline silicon layer 56 and the inside surface of trench 58. The N diffusion region 60 is in contact with the source region 53, and is utilized as a cell node of trench capacitor. Also, the dielectric film 62 functions as dielectric material of the stack and trench capacitor, and may contains an oxide or ONO (SiO2/Si3N4/SiO2) film.

Figure 4F:
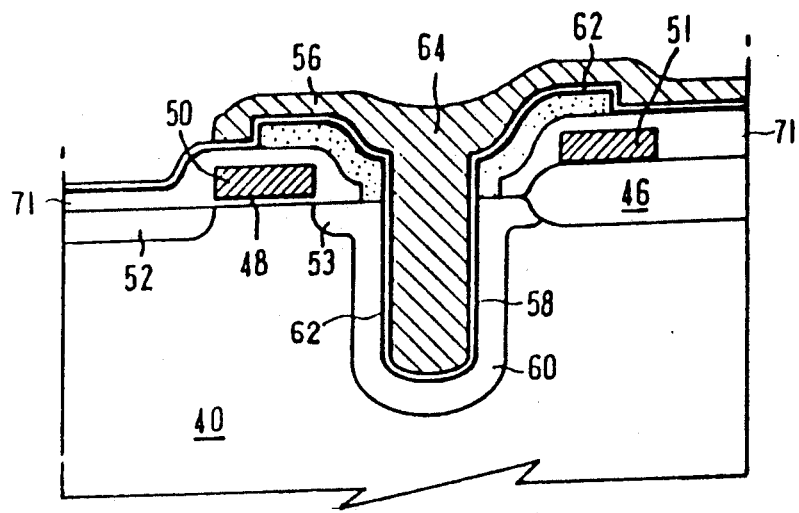

Referring now to FIG. 4F, a second polycrystalline silicon 64 layer is fully deposited on the dielectric film 62 to fill the inside of trench 58, and a cell plate is formed by a photolithographic technique. The second polycrystalline silicon 64 layer is utilized as a cell plate of the stack and trench capacitor, and is doped with POC13.

Figure 4G:
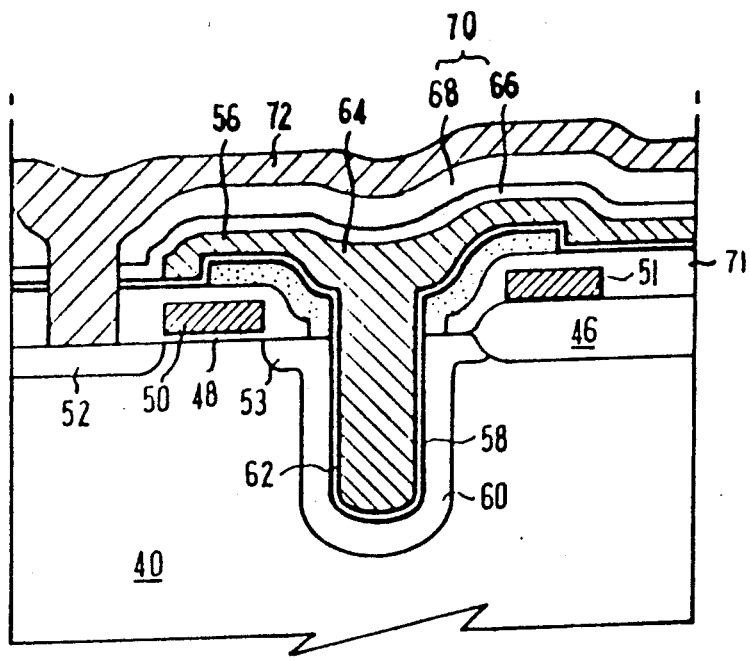

Referring now to FIG. 4G, an oxide film 66 having a thickness of about 500Å is deposited on the dielectric film 62 and the second polycrystalline silicon 64, and BPSG film 68 having a thickness of about 3000 Å is formed on the oxide film 66 for flattening the surface. The oxide film 66 and BPSG film 68 are used as a second insulating film 70. After this processing, there is formed a metal-silicide 72 having a thickness of about 3000 Å to contact a portion of drain region 52 exposed through opening hole formed by a photolithographic technique. The metal-silicide 72 can be a silicide of W or Ti and provides a bit line.

The present invention described above can increase storage capacity by connecting a trench capacitor with a stack capacitor in parallel. It has an advantage that a large-scale integration of elements can be achieved by as follows: the distance between trenches is decreased by limit of diffusion region, since a thermal treatment time is short for forming a trench capacitor after the transistor was formed; and a hole of the trench is small because a polycrystalline silicon layer isn't deposited on the surface of trench for forming a cell node.

While the invention has been particularly shown and described with reference to a preferred embodiment, it will be understood by those skilled in the art that modifications in detail may be made without departing from the spirit and scope of the invention.

What is claimed is:

1. A DRAM cell having a field oxide layer formed on the surface of a semiconductor substrate of a first conductivity type in order to isolate adjacent cells, drain and source regions of a second conductivity type opposite to the first conductivity type mutually separated by a given distance on the substrate, a gate oxide layer on the substrate between said source and drain regions, and word lines of a conductivity type being grown on said field oxide layer, said DRAM cell comprising:
   a trench formed under a given portion between said source region and field oxide layer; a diffusion layer connected with said source region by ion-implanting impurities of a second conductivity type disposed into the substrate around said trench;
   a first polycrystalline silicon layer connected with said source region and isolated from said word lines by a first insulating film;
   a dielectric film formed on an inside surface of said trench and on said first polycrystalline silicon layer;
   a second polycrystalline silicon layer formed on the dielectric film so as to fill the inside of said trench; and
   a bit line connected with said drain region through an opening hole and isolated by a second insulating film.

2. The DRAM cell according to claim 1, wherein said first insulating film is an oxide film.

3. The DRAM cell according to claim 1, wherein said first polycrystalline silicon layer and diffusion layer are connected to said source region is parallel.

4. A semiconductor memory cell comprising:
   a field oxide layer formed on the surface of said semiconductor substrate in order to isolate adjacent cells;
   drain and source regions of a second conductivity type mutually separated by a given distance on the substrate;
   a gate oxide on the substrate between said source and drain regions;
   word lines grown on said field oxide layer;
   a trench formed under a given portion between said source region and field oxide layer;
   a diffusion layer connected with said source region by impurities of a second conductivity type disposed into the substrate said trench;
   a first polycrystalline silicon connected with said source region and isolated from said word lines by a first insulating film;
   a dielectric film formed on the inside of said trench and a first polycrystalline silicon; and
   a second polycrystalline silicon formed on the dielectric film so as to fill the inside of said trench.

5. The DRAM cell according to claim 4, wherein said first polycrystalline silicon and diffusion layer of impurity are connected to source region in parallel.

6. The memory cell according to claim 4, wherein said first insulating film is an oxide film.

7. The memory cell according to claim 4, wherein said first polycrystalline silicon layer and diffusion layer are connected to said source region in parallel.

8. The memory cell according to claim 6, wherein said first polycrystalline silicon layer and diffusion layer are connected to said source region in parallel.

9. A semiconductor memory cell, comprising:
   a semiconductor substrate of a first type conductivity;
   a region of a second type conductivity;
   a gate oxide layer disposed upon a surface of said substrate, adjacent to a first side of said region;
   a word line spaced apart from a second side of said region;
   a trench formed through, and extending into said substrate below said region;
   a diffusion layer connected with said region by impurities of a second type conductivity disposed into the substrate around said trench;
   a first insulating film;
   a first polycrystalline silicon layer connected with said region and isolated from said word line by said first insulating film;
   a dielectric film disposed on an inside surface of said trench and on said first polycrystalline silicon layer; and
   a second polycrystalline silicon layer formed on said dielectric film.

10. The memory cell according to claim 9, wherein said first insulating film is an oxide film.

11. The DRAM cell according to claim 9, wherein said first polycrystalline silicon and diffusion layer are connected in parallel to said region.

* * * * *